United States Patent [19]
Rickerby et al.

[11] Patent Number: 5,981,091
[45] Date of Patent: Nov. 9, 1999

[54] ARTICLE INCLUDING THERMAL BARRIER COATED SUPERALLOY SUBSTRATE

[75] Inventors: David S. Rickerby, Derby; Stanley R. Bell, Herts; Rodney G. Wing, Nottingham, all of United Kingdom

[73] Assignees: Rolls-Royce plc; Chromalloy United Kingdom Limited, both of London, United Kingdom

[21] Appl. No.: 08/837,219

[22] Filed: Apr. 22, 1997

Related U.S. Application Data

[62] Division of application No. 08/574,900, Dec. 19, 1995, Pat. No. 5,667,663.

[30] Foreign Application Priority Data

Dec. 24, 1994 [GB] United Kingdom .................. 9426257
Aug. 10, 1995 [GB] United Kingdom .................. 9516422

[51] Int. Cl.$^6$ ................................................. B32B 15/01
[52] U.S. Cl. ........................... 428/670; 428/548; 428/557; 428/617
[58] Field of Search ..................................... 428/323, 328, 428/329, 544, 546, 557, 548, 617, 668, 670

[56] References Cited

U.S. PATENT DOCUMENTS

| | | | |
|---|---|---|---|
| 3,677,789 | 7/1972 | Bungardt et al. | 148/527 |
| 3,692,554 | 9/1972 | Bungardt et al. | 427/252 |
| 3,819,338 | 6/1974 | Bungardt et al. | 428/652 |
| 3,961,910 | 6/1976 | Baladjanian et al. | 428/652 |
| 3,979,273 | 9/1976 | Panzera et al. | 204/192.15 |
| 3,999,956 | 12/1976 | Stueber et al. | 428/670 |

(List continued on next page.)

FOREIGN PATENT DOCUMENTS

| | | |
|---|---|---|
| 0 376 061 A2 | 7/1990 | European Pat. Off. . |
| 0 705 912 A2 | 4/1996 | European Pat. Off. . |
| 55-113880 | 9/1980 | Japan . |
| 55-115972 | 9/1980 | Japan . |
| 57-140876 | 8/1982 | Japan . |
| 60-052581 | 3/1985 | Japan . |
| 6-306640 | 11/1994 | Japan . |
| 1 318 609 | 5/1973 | United Kingdom . |
| 2 046 369 | 11/1980 | United Kingdom . |
| 2 117 269 | 10/1983 | United Kingdom . |
| 2285632 | 7/1995 | United Kingdom . |
| 92/05298 | 4/1992 | WIPO . |
| 93/18199 | 9/1993 | WIPO . |
| 94/15000 | 7/1994 | WIPO . |

OTHER PUBLICATIONS

R. Lowrie, "Composite Coatings of CoCrAlY Plus Platinum", *Thin Solid Films*, 45 (1977), pp. 491–498.

Birks et al., "Introduction to High Temperature Oxidation of Metals", 1983, p. 128.

A. McMinn et al., "Field Evaluation of Gas Turbine Protective Coatings", *Journal of Engineering of Gas Turbines and Power*, vol. 110, Jan. 1988, p. 142.

T. E. Strangman, "Thermal Barrier Coatings of Turbine Airfoils", *Thin Solids Film*, 127 (1985), pp. 93–105.

J. T. Prater et al., "Ceramic Thermal Barrier Coatings with Improved Corrosion Resistance", *Surface and Coatings Technology*, vol. 32, 1987, pp. 389–397.

*Primary Examiner*—Hoa T. Le
*Attorney, Agent, or Firm*—Oliff & Berridge, PLC

[57] ABSTRACT

A ceramic thermal barrier coating layer for a superalloy article is caused to adhere to the superalloy article by applying platinum to the superalloy article and heat treating at a temperature of 1100° C. to 1200° C. for one hour. This causes aluminum to diffuse from the superalloy article into the platinum to form a platinum enriched outer layer which generally includes a platinum enriched gamma phase and a platinum enriched gamma prime phase. An alumina layer is formed between the platinum enriched outer layer and a ceramic coating. The platinum enriched gamma phase and the platinum enriched gamma prime phase in the outer layer reduces the migration of transition metal elements to the ceramic coating to enable a very pure alumina layer to be formed.

21 Claims, 6 Drawing Sheets

U.S. PATENT DOCUMENTS

| | | | |
|---|---|---|---|
| 4,123,594 | 10/1978 | Chang | 428/651 |
| 4,123,595 | 10/1978 | Chang | 428/667 |
| 4,137,370 | 1/1979 | Fujishiro et al. | 428/660 |
| 4,321,310 | 3/1982 | Ulion et al. | 428/612 |
| 4,321,311 | 3/1982 | Strangman | 428/623 |
| 4,399,199 | 8/1983 | McGill et al. | 428/633 |
| 4,401,697 | 8/1983 | Strangman | 427/250 |
| 4,405,659 | 9/1983 | Strangman | 427/248.1 |
| 4,405,660 | 9/1983 | Ulion et al. | 427/248.1 |
| 4,414,249 | 11/1983 | Ulion et al. | 427/248.1 |
| 4,477,538 | 10/1984 | Clarke | 428/656 |
| 4,530,885 | 7/1985 | Restall | 428/670 |
| 4,643,951 | 2/1987 | Keem et al. | 428/469 |
| 4,676,994 | 6/1987 | Demaray | 427/566 |
| 4,722,869 | 2/1988 | Honda et al. | 428/611 |
| 4,880,614 | 11/1989 | Strangman et al. | 428/623 |
| 4,916,022 | 4/1990 | Solfest et al. | 428/623 |
| 5,015,502 | 5/1991 | Strangman et al. | 427/248.1 |
| 5,180,285 | 1/1993 | Lau | 416/214 B |
| 5,236,745 | 8/1993 | Gupta et al. | 427/454 |
| 5,238,752 | 8/1993 | Duderstadt et al. | 428/623 |
| 5,427,866 | 6/1995 | Nagaraj et al. | 428/610 |
| 5,500,252 | 3/1996 | Meelu | 427/376.3 |
| 5,514,482 | 5/1996 | Strangman | 428/623 |
| 5,652,044 | 7/1997 | Rickerby | 428/216 |
| 5,716,720 | 2/1998 | Murphy | 428/623 |
| 5,759,640 | 6/1998 | Mannava et al. | 427/554 |
| 5,759,932 | 6/1998 | Sangeeta et al. | 501/85 |
| 5,763,107 | 6/1998 | Rickerby et al. | 428/623 |
| 5,780,110 | 7/1998 | Schaeffer et al. | 427/327 |
| 5,792,521 | 8/1998 | Wortman | 427/567 |
| 5,824,423 | 10/1998 | Maxwell et al. | 428/623 |

ARTICLE INCLUDING THERMAL BARRIER COATED SUPERALLOY SUBSTRATE

This is a Division of Application Ser. No. 08/574,900 filed Dec. 19, 1995 now U.S. Pat. No. 5,667,663.

FIELD OF THE INVENTION

The present invention relates to a method of applying a thermal barrier coating to the surface of a superalloy article, e.g. a gas turbine engine turbine blade.

BACKGROUND

The constant demand for increased operating temperatures in gas turbine engines was initially met by air cooling of the turbine blades and development of superalloys from which to manufacture the blades, both of which extended their service lives. Further temperature increases necessitated the development of ceramic coating materials with which to insulate the turbine blades from the heat contained in the gases discharged from the combustion chamber and again turbine operating life was extended. However, the amount of life extension was limited because the coatings suffered from inadequate adhesion to the superalloy substrates, one reason for this being the disparity of coefficients of thermal expansion between the superalloy substrate and the ceramic coating. Coating adhesion was improved by the development of various types of aluminum-containing alloy bond coats which were thermally sprayed or otherwise applied to the superalloy substrate before the application of the ceramic coating. Such bond coats are typically of the so-called aluminide (diffusion) or "MCrAlY" types, where M signifies one or more of cobalt, nickel and iron.

Use of bond coats has been successful in preventing extensive spallation of thermal barrier coatings during service, but localized spallation of the ceramic still occurs where the adhesion fails between the bond coat and the ceramic layer. This exposes the bond coat to the full heat of the combustion gases, leading to premature failure of the turbine blade.

The bond coats of the aluminide (diffusion) type are disclosed for example in U.S. Pat. Nos. 4,880,614, 4,916,022 and 5,015,502. This type of bond coat is produced by reacting aluminum with the superalloy substrate to produce a diffusion aluminide bond coat. The aluminum is reacted with the superalloy substrate by any of the commercially available aluminizing processes using aluminum vapors or aluminum rich alloy powder, for example pack aluminizing, chemical vapor deposition, sputtering, electrophoresis, etc. and is followed by diffusion heat treatment. These patents also disclose the use of platinum aluminide bond coats on the superalloy substrate.

The bond coats of the MCrAlY type are disclosed in the U.S. Pat. Nos. 4,321,311, 4,401,697 and 4,405,659. This type of bond coat is produced by depositing a MCrAlY alloy onto the superalloy substrate.

Furthermore the three U.S. Pat. Nos. 4,880,614, 4,916,022 and 5,015,502 mentioned above also disclose the use of an aluminide coating in conjunction with a MCrAlY coating as a bond coating. More specifically they disclose that the substrate is first aluminized, as discussed above, and then a MCrAlY coating is applied onto the aluminized superalloy substrate.

Also International Patent application No. WO93/18199 discloses the use of an aluminide coating in conjunction with a MCrAlY coating as a bond coating. More specifically it discloses that the superalloy has a MCrAlY coating with an aluminide top coating or a MCrAlY coating with a platinum aluminide top coating.

It is further known from U.S. Pat. No. 4,399,199 to provide a platinum-group metal layer on a superalloy substrate as a bond coating for a ceramic thermal barrier coating. The platinum-group metal is heat treated at 700° C. to bond the platinum-group metal to the superalloy substrate.

It is also known from U.S. Pat. No. 5,427,866 to provide a platinum-group metal layer on a superalloy substrate as a bond coating for a ceramic thermal barrier coating. The platinum-group metal is heat treated at 980° C. to 1095° C. to form an interdiffusion region of platinum-group metal aluminide between the superalloy substrate and the platinum-group metal.

A problem associated with the production of the platinum aluminide on the superalloy substrate is that the use of the conventional aluminizing process, e.g. pack aluminizing, uses a pack containing aluminum oxide powder and aluminum halide which produces aluminum vapors to react with platinum deposited on the superalloy substrate. This pack also contains undesirable elements, or impurities, which also react with the platinum on the superalloy substrate leading to poor adhesion between the platinum aluminide and the ceramic coating.

A problem associated with the production of the interdiffusion region of platinum aluminide between the platinum and the superalloy substrate is that the bond coating is unstable leading to poor adhesion between the ceramic coating and the bond coating.

SUMMARY OF THE INVENTION

Thus one object of the present invention is to provide a method of applying a thermal barrier coating to a superalloy substrate so as to achieve improved adhesion thereto.

Accordingly the present invention provides a method of applying a multi-layer thermal barrier coating to a superalloy article comprising the steps of:

applying a layer of a platinum-group metal to the superalloy article, heat treating the article to diffuse the platinum-group metal into the superalloy article and thereby create a platinum-group metal enriched outer layer on the superalloy article, the heat treatment being carried out at a temperature in the range of above 1100° C. to 1200° C. dependent upon the solution heat treatment temperature appropriate for the superalloy article and for a time sufficient such that the platinum-group metal enriched outer layer of the superalloy article predominantly comprises a platinum enriched gamma phase and a platinum enriched gamma prime phase, and applying a ceramic layer to the superalloy article.

The heat treatment is carried out for up to six hours, preferably for one hour.

Preferably the method includes creating a thin adherent layer of oxide on the platinum-group metal enriched outer layer of the superalloy article, and applying the ceramic layer on the oxide layer.

The method may include applying an aluminum containing alloy coating to the platinum-group metal enriched outer layer of the superalloy article, creating a thin adherent layer of oxide on the aluminum containing alloy coating, and applying the ceramic layer to the oxide layer. The aluminum-containing alloy coating may comprise a MCrAlY alloy, where M is at least one of Ni, Co and Fe.

Preferably the platinum-group metal is applied by electroplating.

Preferably the thickness of the layer of platinum as applied before heat treatment is greater than 3 micrometers. More preferably the thickness of the layer of platinum as applied before heat treatment is at least 5 micrometers. Preferably the thickness of the layer of platinum as applied before heat treatment is less than 12.5 micrometers.

Preferably the thin adherent layer of oxide is created by heating the platinum-group metal enriched outer layer in an oxygen containing atmosphere.

Preferably the thin adherent layer of oxide is created by heating the aluminum containing alloy coating in an oxygen containing atmosphere.

Preferably the ceramic layer is applied by electron beam physical vapor deposition.

Preferably the thin adherent layer of oxide is created during the process of electron beam physical vapor deposition.

Preferably a controlled amount of hafnium, or yttrium, is applied with, or to, the layer of platinum-group metal. Preferably the hafnium or yttrium is applied by physical vapor deposition, e.g. sputtering, or by chemical vapor deposition. Preferably hafnium up to 0.8 wt % is added, or yttrium up to 0.8 wt % is added.

Preferably the superalloy article comprises more than 4.5 wt % aluminum, less than 1.5 wt % hafnium and less than 1.5 wt % titanium.

The method may include applying an additional layer, for example cobalt, or chromium, to the superalloy article before applying the platinum-group metal to the superalloy article. Alternatively the method may include applying an additional layer, for example cobalt, or chromium, to the platinum-group metal layer before heat treating the article to diffuse the platinum into the superalloy article. Preferably the additional layer is applied by state of the art techniques for example by physical vapor deposition (PVD), by an electroplating process or by chemical vapor deposition (CVD). Preferably the thickness of the additional layer as applied before heat treatment is up to 8 micrometers.

Preferably the platinum-group metal is platinum.

The present invention also provides a multi-layer thermal barrier coating for a superalloy article comprising a platinum-group metal enriched outer layer on the superalloy article, the outer layer of the superalloy predominantly comprising a platinum-group metal enriched gamma phase matrix and a platinum-group metal enriched gamma prime phase, a thin adherent layer of oxide on the platinum-group metal enriched outer layer of the superalloy article, and a ceramic layer on the oxide layer.

The present invention also provides a multi-layer thermal barrier coating for a superalloy article comprising a platinum-group metal enriched outer layer on the superalloy article, the outer layer of the superalloy predominantly comprising a platinum-group metal enriched gamma phase matrix and a platinum-group metal enriched gamma prime phase, an aluminum containing alloy coating on the platinum-group metal enriched outer layer of the superalloy article, a thin adherent layer of oxide on the aluminum containing alloy coating, and a ceramic layer on the oxide layer.

Preferably the ceramic layer comprises yttria stabilized zirconia.

Preferably the ceramic layer has a columnar structure.

Preferably the superalloy substrate comprises a nickel based superalloy.

Preferably the superalloy article comprises more than 4.5 wt % aluminum, less than 1.5 wt % hafnium and less than 1.5 wt % titanium.

Preferably the platinum-group metal enriched outer layer comprises hafnium up to 0.8 wt %, or yttrium up to 0.8 wt %.

The platinum-group metal enriched layer may be enriched in cobalt or chromium.

Preferably the platinum-group metal is platinum.

The invention will be more fully described by way of example with reference to the accompanying drawings, in which:

DETAILED DESCRIPTION OF PREFERRED EMBODIMENTS

Figure 1:
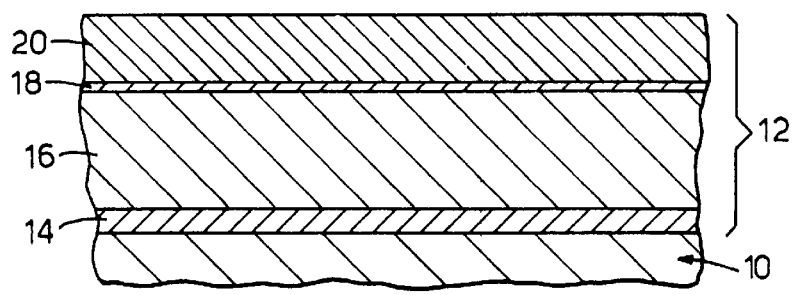
FIG. 1 is a cross-sectional diagrammatic view through a metallic article having a thermal barrier coating produced by a method according to the present invention.

Referring to FIG. 1, illustrating a superalloy article 10 provided with a multi-layer thermal barrier coating indicated generally by numeral 12. It is shown in the "as manufactured" condition. The thermal barrier coating 12 comprises a platinum enriched outer layer 14 on the surface of the substrate of the superalloy article 10, a MCrAlY alloy bond coat layer 16 on the platinum enriched layer 14, a thin oxide layer 18 on the MCrAlY alloy bond coat layer 16 and a ceramic layer 20 on the thin oxide layer 18. The MCrAlY is generally a NiCrAlY, a CoCrAlY, a NiCoCrAlY or a FeCrAlY, as is well known to those skilled in the art.

The superalloy article 10, which forms the substrate for the coating 12, was made of a nickel or cobalt based superalloy.

In this example the MCrAlY bond coat alloy 16 has a nominal composition given in Table 1 below.

TABLE 1

| ELEMENT | WEIGHT % MINIMUM | WEIGHT % MAXIMUM |
| --- | --- | --- |
| Nickel | 31.0 | 33.0 |
| Chromium | 29.0 | 22.0 |
| Aluminum | 7.0 | 9.0 |
| Yttrium | 0.35 | 0.65 |
| Carbon | 0.0 | 0.025 |
| Oxygen | 0.0 | 0.050 |
| Nitrogen | 0.0 | 0.010 |
| Hydrogen | 0.0 | 0.010 |
| Other Elements in total | 0.0 | 0.5 |
| Cobalt | Balance | |

The alloy specified in Table 1 is available from Praxair Surface Technologies Inc, (formerly Union Carbide Coating Service Corporation), of Indianapolis, U.S.A., under the trade name LCO22.

To produce the coating 12 the following procedure is followed. After thorough preparation and cleaning of the surface of the superalloy article 10 by grit blasting with fine alumina grit and degreasing, a layer of platinum having a substantially constant thickness of about 8 micrometers was applied to the superalloy substrate. The thickness of the platinum layer may vary upwards from about 3 micrometers, depending upon a number of factors, such as substrate and bond coat materials used, diffusion temperatures and service conditions. The platinum layer was applied by electroplating, but any other means could be used which will achieve a sufficient substantially uniform thickness without detriment to the material's properties.

A diffusion heat treatment step was then effected so as to cause the platinum layer to combine with the superalloy substrate 10. This provided the platinum enriched outer layer 14 on the superalloy substrate 10. Diffusion was achieved by heating the superalloy article 10 to a temperature of 1190° C. in a vacuum chamber and holding that temperature for one hour. In performing the invention a range of heat treatment temperatures may be used from 1100° C. to 1200° C. inclusive, according to the solution heat treatment temperature normally used for the superalloy article 10. In the present example, 1190° C. is higher than the accepted solution heat treatment temperature for the superalloy article, but was utilized as one of a range of diffusion treatments as explained later. Although different diffusion times may be used, for example diffusion times up to six hours have been used, it was judged that one hour was sufficient at this range of temperatures for the platinum to be properly combined with the superalloy substrate 10 without prematurely aging the superalloy substrate 10. We have found that there is no significant benefit from using diffusion times greater than about one hour.

The microstructure of the superalloy substrate generally comprises two phases, these being a gamma phase and a gamma prime phase. The gamma prime phase forms a reinforcement in the gamma phase matrix. The heat treatment of the platinum layer on the superalloy substrate causes aluminum in the superalloy substrate to be diffused outwards towards the platinum layer on the surface of the superalloy substrate. This results in the formation of a platinum enriched gamma phase and a platinum enriched gamma prime phase in the outer surface layer of the superalloy article. After heat treatment the surface was grit blasted with dry alumina powder of a 120–220 micrometer particle size to remove any diffusion residues.

The MCrAlY alloy powder mix was thermally sprayed in known manner onto the platinum enriched layer 14 of the superalloy article 10 by use of a plasma gun in an evacuated chamber to produce the MCrAlY bond coat layer 16. Alternatively the MCrAlY may be applied by any other suitable method for example electron beam physical vapor deposition (EBPVD).

To ensure bonding of the MCrAlY bond coat layer 16 to the platinum enriched outer layer 14 of the superalloy article 10, the MCrAlY coated superalloy article 10 was diffusion heat treated at 1100° C. for one hour. This produces a three phase alloy microstructure in the MCrAlY alloy bond coat layer 16. The microstructure of the MCrAlY bond coat layer 16 broadly comprises three phases, these being an alpha phase, a beta phase, and a small amount of an yttrium-rich phase. The alpha phase comprises a solid solution of nickel, cobalt, chromium, yttrium and aluminum. The beta phase comprises an aluminide of cobalt, nickel and aluminum, with chromium and other metallic elements dissolved in the aluminide up to certain solubility limits.

After removal of diffusion residues by grit blasting and degreasing, a layer of a ceramic 20 consisting of partially stabilized zirconia (in this case, zirconia containing 8% by weight of yttria) was applied by electron beam physical vapor deposition (EBPVD). This coating is available from Chromalloy Gas Turbine Corporation of Delaware, U.S.A.

For the EBPVD process, the article was first held in a preheating chamber and preheated to a temperature of about 1000° C. at a pressure of about $10^{-5}$ Torr. It was then immediately transferred to an electron beam coating chamber, where it continued to be held for coating at 1000° C., at a pressure of $10^{-2}$ to $10^{-3}$ Torr, in an atmosphere consisting of argon and oxygen.

It should be noted that some of the free oxygen in the coating chamber's atmosphere results from the dissociation of zirconia as it is evaporated by the electron beam in the coating chamber. The dissociated constituents of the ceramic recombine with each other as the vapor is deposited on the article. However, unless assisted, this recombination tends to be incomplete, i.e., the oxygen binds to the zirconium in sub-stoichiometric proportions, resulting in a deficiency of oxygen in the ceramic and free oxygen in the atmosphere of the coating chamber. Recombination of the ceramic in stoichiometric proportions is assisted by providing an excess of oxygen, thereby further adding to the amounts of oxygen in the coating chamber.

The presence of oxygen at an elevated temperature during the EBPVD coating process made it inevitable that a thin oxide layer 18 formed on the surface of the MCrAlY bond coat layer 16. The oxide layer 18 was covered by the ceramic layer 20 and the oxide layer comprises a mixture of alumina, chromia and other spinels.

EXAMPLE 1

A batch of specimens as illustrated in FIG. 1 were produced using a nickel superalloy called MAR-M 002, a trade name of the Martin Marietta Corporation, of Bethesda, Md., U.S.A. Its nominal composition is given in Table 2 below.

TABLE 2

| ELEMENT | WEIGHT % |
| --- | --- |
| Tungsten | 10 |
| Cobalt | 10 |
| Chromium | 9 |
| Aluminum | 5.5 |
| Tantalum | 2.5 |

TABLE 2-continued

| ELEMENT | WEIGHT % |
| --- | --- |
| Titanium | 1.5 |
| Hafnium | 1.5 |
| Carbon | 0.15 |
| Nickel | Balance |

Some specimens were subjected to a standardized adhesion test in which the strength of the bond between the ceramic layer and the platinum enriched outer layer on the superalloy substrate was determined. On average it was found that the critical load, beyond which the ceramic would break away from the superalloy substrate was about 85 Newtons.

The remaining specimens were then subjected to an aging process to simulate a period of service in the turbine of a gas turbine engine. The aging processes were 100 hours at 1050° C., 100 hours at 1100° C. and 100 hours at 1150° C. On average it was found that the critical load, beyond which the ceramic would break away from the superalloy substrate was about 65 Newtons for aging for 100 hours at 1050° C., 40 Newtons for aging for 100 hours at 1100° C. and 0 Newtons for aging for 100 hours at 1150° C.

Figure 2:
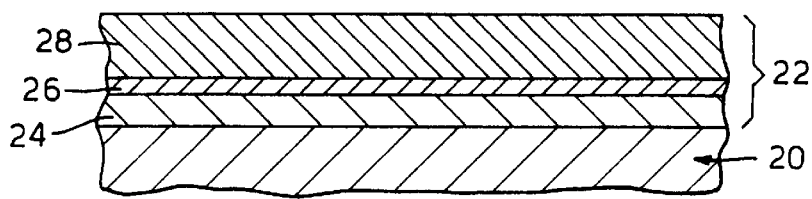
FIG. 2 is cross-sectional diagrammatic view through an alternative metallic article having a thermal barrier coating produced by a method according to the present invention.

Referring to FIG. 2, illustrating a superalloy article 20 provided with a multi-layer thermal barrier coating indicated generally by numeral 22. It is shown in the "as manufactured" condition. The thermal barrier coating 22 comprises a platinum enriched outer layer 24 on the surface of the substrate of the superalloy article 20, a thin oxide layer 26 on the platinum enriched layer 24 and a ceramic layer 28 on the thin oxide layer 26.

The superalloy article 20, which forms the substrate for the coating 22, was made of a nickel or cobalt based superalloy.

To produce the coating 22 the following procedure is followed. After thorough preparation and cleaning of the surface of the superalloy article 20 by grit blasting with fine alumina grit and degreasing, a layer of platinum having a substantially constant thickness of about 8 micrometers was applied to the superalloy substrate. The thickness or the platinum layer may again vary upwards from about 3 micrometers, depending upon a number of factors, such as substrate, diffusion temperatures and service conditions. The platinum layer was applied by electroplating, but any other means could be used which will achieve a sufficient substantially uniform thickness without detriment to the material's properties.

A diffusion heat treatment step was then effected so as to cause the platinum layer to combine with the superalloy substrate 20. This provided the platinum enriched outer layer 24 on the superalloy substrate 20. Diffusion was achieved by heating the superalloy article 20 to a temperature of 1150° C. in a vacuum chamber and holding that temperature for one hour. In performing the invention a range of heat treatment temperatures may be used from 1100° C. to 1200° C. inclusive, according to the solution heat treatment temperature normally used for the superalloy article 20. Although different diffusion times could be used, for example up to six hours may be used, it was judged that one hour was sufficient at this range of temperatures for the platinum to be properly combined with the superalloy substrate 20 without prematurely aging the superalloy substrate 20.

Figure 3:
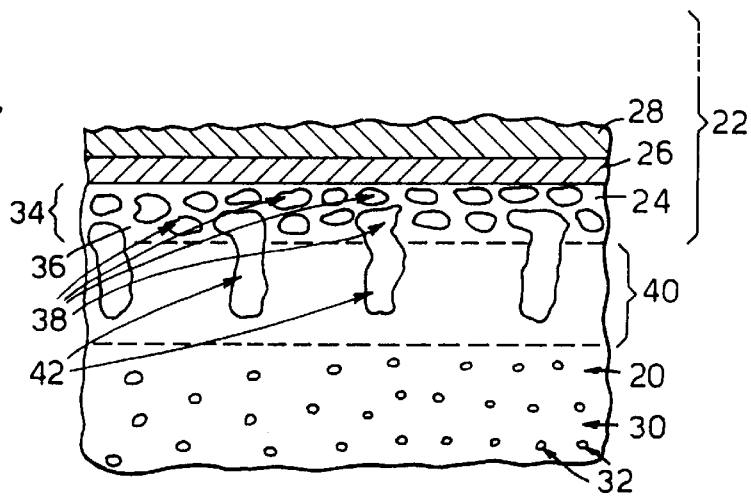
FIG. 3 is an enlarged cross-sectional view through the thermal barrier coating in FIG. 2.

The microstructure of the superalloy substrate 20 generally comprises two phases, as seen more clearly in FIG. 3, these being a gamma phase matrix 30 and a gamma prime phase 32 in the gamma phase matrix 30. The gamma prime phase 32 forming a reinforcement in the gamma phase matrix 30. The heat treatment of the platinum layer 34 on the superalloy substrate 20 causes aluminum in the superalloy substrate 20 to be diffused outwards towards the platinum layer 34 on the surface of the superalloy substrate 20. This results in the formation of a platinum enriched gamma phase 36 and a platinum enriched gamma prime phase 38 in the outer surface layer of the superalloy article 20. The aluminum in the platinum enriched outer surface layer 24 of the superalloy article 20 is available for formation of alumina 26. It is to be noted that the region 40 of the superalloy article 20 immediately below the platinum enriched outer surface layer 24 does not have any gamma prime phase 32. The heat treatment causes the aluminum in this gamma prime phase to move to the platinum layer 34 and hence breaks down the gamma prime phase due to aluminum's greater chemical affinity for platinum.

It is to be noted that some of the regions of platinum enriched gamma prime phase 38 in the platinum enriched outer surface layer 24 have distinct promontories, or pegs, which have grown inwardly into the region 40 of the superalloy article 20. It is believed that these platinum enriched gamma prime phase pegs 42 grow into the superalloy article and draw the aluminum from the gamma prime phase regions in the superalloy article 20. Thus it can be seen that the platinum in the platinum layer only diffuses into the superalloy article 20 in these distinct platinum enriched gamma prime pegs 42, rather than as a continuous band of platinum. The extent of growth of the platinum enriched gamma prime pegs 42 is sensitive to the thickness of the platinum layer and the diffusion temperature, as discussed later.

The platinum levels in the platinum enriched gamma prime phase 38 and the platinum enriched gamma phase 36 are about equal, showing that both of these phases are equally favored.

It is also to be noted that if there is sufficient aluminum in the superalloy article a continuous platinum enriched gamma prime phase forms on a platinum enriched gamma phase matrix containing platinum enriched gamma prime phases. Furthermore there is always a layer of platinum enriched gamma phase immediately underneath the alumina layer as platinum enriched gamma prime phase breaks down to the platinum enriched gamma phase when it loses aluminum to form alumina.

To enhance the thermal barrier coating adhesion to the superalloy article 20 it is desirable to ensure phase stability within the platinum enriched gamma phase 36 and the platinum enriched gamma prime phase 38. The stability is achieved by appropriate selection of the platinum thickness within the specified heat treatment temperature range of above 1100° C. to 1200° C. In addition it is important to ensure that any phase changes which occur in operation, within a gas turbine engine, result in small volume changes. This is achieved by control of the composition of the platinum enriched gamma phase 36 and platinum enriched gamma prime phase 38. The composition of the platinum enriched gamma and platinum enriched gamma prime phases are balanced, i.e. the compositions are closely matched, and any changes from the platinum enriched gamma prime phase to the platinum enriched gamma phase only results in small volume changes.

After heat treatment the surface was grit blasted with dry alumina powder of a 120–220 micrometer particle size to remove any diffusion residues.

After removal of diffusion residues by grit blasting and degreasing, a layer of a ceramic 28 consisting of partially stabilized zirconia (in this case, zirconia containing 8% by weight of yttria) was applied by electron beam physical vapor deposition (EBPVD). This coating is available from Chromalloy Gas Turbine Corporation of Del., U.S.A.

For the EBPVD process, the article was first held in a preheating chamber and preheated to a temperature of about 1000° C. at a pressure of about $10^{-5}$ Torr. It was then immediately transferred to an electron beam coating chamber, where it continued to be held for coating at 1000° C., at a pressure of $10^{-2}$ to $10^{-3}$ Torr, in an atmosphere consisting of argon and oxygen.

The presence of oxygen at an elevated temperature during the EBPVD coating process made it inevitable that a thin oxide layer 26 formed on the surface of the platinum enriched outer layer 24 of the superalloy article 20 which comprises the platinum enriched gamma phase 36 and platinum enriched gamma prime phase 38. The oxide layer 26 was covered by the ceramic layer 28 and the oxide layer comprises alumina.

EXAMPLE 2

A batch of specimens as illustrated in FIG. 2 were produced using a nickel superalloy called CMSX-4, a trade name of the Cannon-Muskegon Corporation, of 2875 Lincoln Street, Muskegon, Mich., MI 49443-0506 U.S.A. Its nominal composition is given in Table 3 below. The superalloy article specimens were coated with 7 micrometers thickness of platinum.

TABLE 3

| ELEMENT | WEIGHT % |
| --- | --- |
| Tungsten | 6.4 |
| Cobalt | 9.5 |
| Chromium | 6.5 |
| Rhenium | 3.0 |
| Aluminum | 5.6 |
| Tantalum | 6.5 |
| Titanium | 1.0 |
| Hafnium | 0.1 |
| Molybdenum | 0.6 |
| Carbon | 0.006 |
| Nickel | Balance |

Some specimens were subjected to a standardized adhesion test in which the strength of the bond between the ceramic layer and the platinum enriched outer layer on the superalloy substrate was determined. On average it was found that the critical load, beyond which the ceramic would break away from the superalloy substrate was about 30 Newtons.

The remaining specimens were then subjected to an aging process to simulate a period of service in the turbine of a gas turbine engine. The aging processes were 25 hours at 1100° C., 25 hours at 1150° C. and 25 hours at 1170° C. On average it was found that the critical load, beyond which the ceramic would break away from the superalloy substrate was about 10 Newtons for aging for 25 hours at all three temperatures tested.

EXAMPLE 3

A batch of specimens as illustrated in FIG. 2 were produced using a nickel superalloy called CMSX-10, a trade name of the Cannon-Muskegon Corporation, of 2875 Lincoln Street, Muskegon, Mich., MI 49443-0506 U.S.A. Its nominal composition is given in Table 4 below. The superalloy article specimens were coated with 7 micrometers thickness of platinum.

TABLE 4

| ELEMENT | WEIGHT % |
| --- | --- |
| Tungsten | 5.5 |
| Cobalt | 3.3 |
| Chromium | 2.2 |
| Rhenium | 6.2 |
| Aluminum | 5.8 |
| Tantalum | 8.3 |
| Titanium | 0.2 |
| Molybdenum | 0.4 |
| Niobium | 0.1 |
| Nickel | Balance |

Some specimens were subjected to a standardized adhesion test in which the strength of the bond between the ceramic layer and the platinum enriched outer layer on the superalloy substrate was determined. On average it was found that the critical load, beyond which the ceramic would break away from the superalloy substrate was about 25 Newtons.

The remaining specimens were then subjected to an aging process to simulate a period of service in the turbine of a gas turbine engine. The aging processes were 25 hours at 1100° C., 25 hours at 1150° C. and 25 hours at 1170° C. On average it was found that the critical load, beyond which the ceramic would break away from the superalloy substrate was about 10 Newtons for aging for 25 hours at all three temperatures tested.

EXAMPLE 4

A batch of specimens as illustrated in FIG. 2 were produced using a nickel based superalloy called MAR-M 002, a trade name of the Martin Marietta Corporation, of Bethesda, Md., U.S.A. Its nominal composition is given in Table 2 above. The superalloy article specimens were coated with 7 micrometers thickness of platinum.

Some specimens were subjected to a standardized adhesion test in which the strength of the bond between the ceramic layer and the platinum enriched outer layer on the superalloy substrate was determined. On average it was found that the critical load, beyond which the ceramic would break away from the superalloy substrate was about 20 Newtons.

The remaining specimens were then subjected to an aging process to simulate a period of service in the turbine of a gas turbine engine. The aging processes were again 25 hours at 1100° C., 25 hours at 1150° C. and 25 hours at 1170° C. On average it was found that the critical load, beyond which the ceramic would break away from the superalloy substrate was about 0 Newtons for aging for 25 hours at all three temperatures tested.

Figure 4:
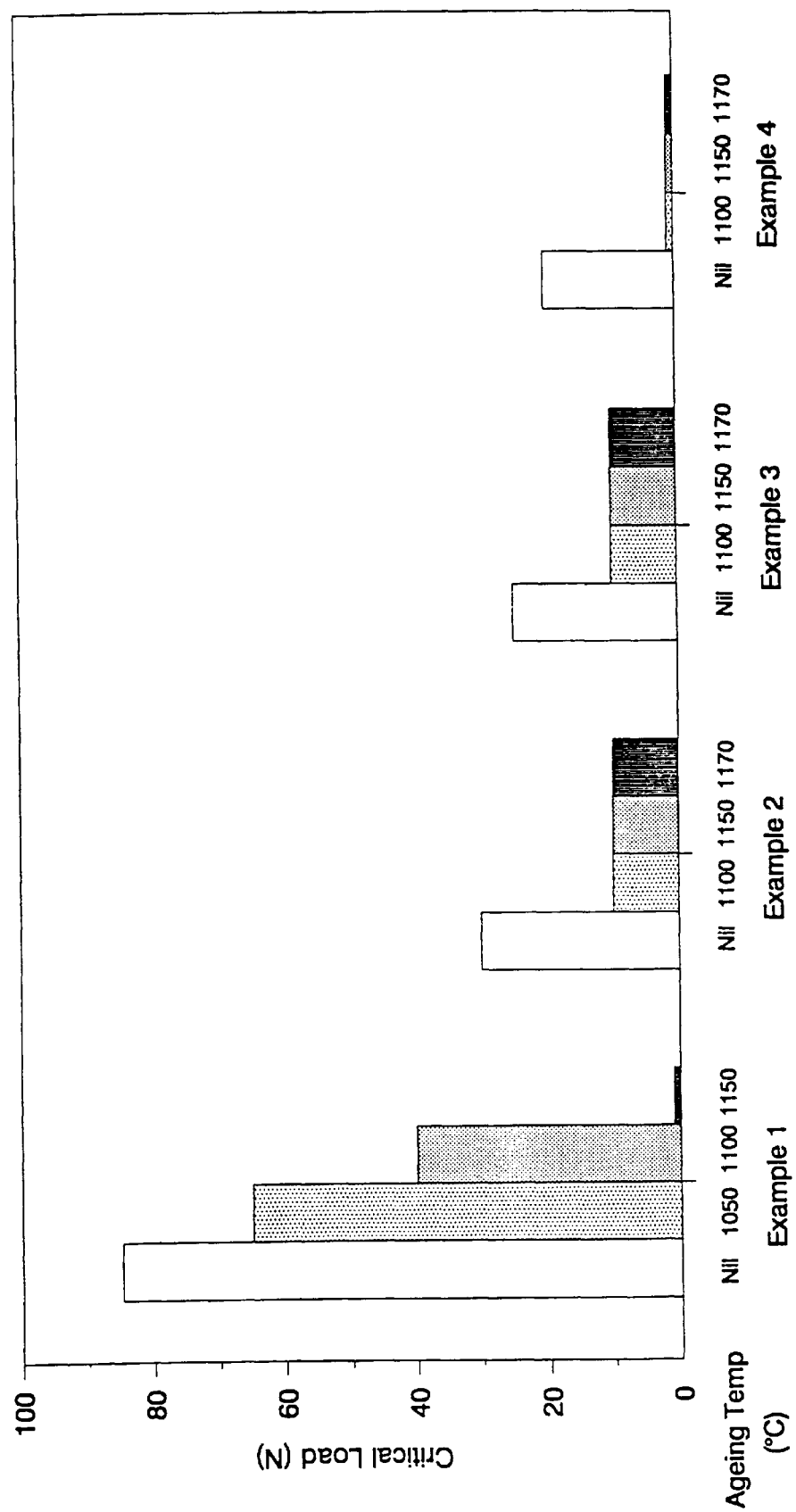
FIG. 4 is a bar chart showing the results of tests of relative performance of four different coating types produced on different superalloy substrates.

FIG. 4 shows the comparative adhesion strengths for coatings according to Examples 1, 2, 3 and 4 when subjected to a range of aging treatments.

It is seen from Examples 2, 3 and 4 that the application of platinum and the heat treatment of the platinum plated superalloy article does not always produce a satisfactory bond between the superalloy article and the ceramic coating. We believe this is because of the constituents in the superalloy article. For example the process produces satisfactory bonds for CMSX-4 and CMSX-10 but not for MAR-M 002. This is because the proportions of hafnium and titanium in particular in the MAR-M 002 are too high.

It is believed that the platinum in the platinum enriched outer layer 24 of the superalloy article aids the formation of alumina 26, which is the key to the bonding of the ceramic layer 28 to the superalloy article 20. The platinum in the platinum enriched outer layer 24 causes the aluminum to diffuse from the superalloy substrate into the platinum enriched outer layer 24 of the superalloy article 20. It is also believed that the platinum in the platinum enriched outer layer 24 of the superalloy article 20 also acts as a barrier to the migration of transition metal elements from the superalloy article 20 into the base of the ceramic layer 20 thereby preventing the growth of spinels or other mixed oxides with lattice structures incompatible with alumina. However, the platinum enriched layer 24 is not sufficient to prevent relatively large amounts of titanium and hafnium migrating from the superalloy article 20 to the base of the ceramic layer 28. This is because the platinum enriched layer 24 comprises the platinum enriched gamma phase and platinum enriched gamma prime phase, and hence there isn't a continuous gamma prime phase barrier to the migration of hafnium and titanium. It is possible for the titanium and hafnium to migrate through the platinum enriched gamma phase matrix. We have found that if the proportion of hafnium in the superalloy article is below about 1.5 wt % the platinum enriched layer 24 prevents the hafnium from migrating to the ceramic layer. We have also found that if the proportion of titanium in the superalloy article is below about 1.5 wt % the platinum enriched layer 24 prevents the titanium from migrating to the ceramic layer.

Furthermore the relationship between the level of aluminum in the superalloy article and the levels of hafnium and titanium is critical. If the ratio of aluminum to hafnium and/or titanium is below about 3 the platinum enriched layer 24 does not prevent the hafnium and/or titanium migrating to the ceramic layer.

If the titanium is present in the superalloy as a carbide, for example titanium carbide or titanium/tantalum carbide, it is not free to migrate to the oxide bonding layer. However if the titanium is not bound up in the superalloy as a carbide it is free to migrate to the ceramic layer. Thus if there is more than about 1.5 wt % of free titanium in the superalloy then the platinum enriched layer 24 does not prevent the titanium migrating to the ceramic layer. For example the CMSX-4 superalloy which has 1.0 wt % titanium, which is all free titanium as there is very little carbon to form carbides, forms a satisfactorily bonded ceramic layer. It is believed that the platinum forms strong complex molecules with free titanium and prevents the titanium migrating to the ceramic layer. We have found by analysis of the oxide layer formed on the platinum enriched outer layer of the CMSX-4 superalloy that the oxide comprises alumina. However, the oxide layer formed directly on the CMSX-4 superalloy without a platinum enriched layer comprises a mixture of alumina and titanium/tantalum oxide. Thus it can be seen that the platinum enriched layer prevents the migration of titanium to the ceramic layer.

If the level of aluminum in the superalloy article is below about 4.5 wt % there is insufficient aluminum in the superalloy article to be diffused into the platinum enriched layer 24 to form a continuous layer of alumina.

However hafnium is beneficial to the bonding and formation of the alumina in controlled amounts, below a certain level. We prefer to add controlled amounts of hafnium and/or yttrium to the platinum layer. The hafnium and/or yttrium is added to the platinum layer by physical vapor deposition (PVD), or chemical vapor deposition (CVD). The hafnium is added to the platinum layer up to a level of 0.8 wt % and the yttrium is added to the platinum up to a level of 0.8 wt %.

In another variation of the invention a layer of cobalt, or chromium, is applied onto the superalloy article by electroplating. Subsequently a layer of platinum is applied onto the cobalt, or chromium, layer by electroplating. Thereafter the cobalt, or chromium, and platinum layers on the superalloy article are heat treated at a temperature in the range of 1100° C. to 1200° C. to form a platinum enriched outer layer on the superalloy article. This again forms platinum enriched gamma prime and platinum enriched gamma phases. The cobalt, or chromium, also goes into the gamma and gamma prime phases and form complexes. The cobalt, or chromium, also enhance the formation of alumina. After the heat treatment step the ceramic layer is again deposited upon an oxide layer which forms on the platinum enriched layer before or during the electron beam physical vapor deposition of the ceramic layer. The cobalt, or chromium, is deposited to a thickness up to 5 micrometers. Alternatively it is possible to firstly apply the platinum onto the superalloy article and then to deposit the cobalt, or chromium. However, the former procedure is the preferred process.

The attributes of a good bond coating for good adhesion of a thermal barrier coating are that the bond coating should have the ability to prevent, or reduce, the migration of transition metal elements to the ceramic thermal barrier coating. The migration of transition metal elements is preferably blocked by a continuous layer in the bond coating or slowed by formation of stable compounds by a layer in the bond coating. This attribute enables the resulting thermally grown oxide formed on the bond coating to be very pure alumina. The bond coating should be stable to aging at high temperatures so that it still prevents, or reduces, the migration of the transition metal elements to ensure any further growth of the oxide on the bond coating is by formation of alumina. These attributes are facilitated by the formation of a stable layer close to the thermally grown oxide interface between the bond coating and the ceramic thermal barrier coating.

The advantages of using the ceramic layer directly upon a platinum enriched outer layer of a superalloy article, rather than using ceramic upon a MCrAlY bond coat, ceramic upon a platinum enriched outer layer of a MCrAlY bond coat is that it has reduced weight, making it more acceptable for aero gas turbine engines, and it is cheaper to manufacture. Additionally the coating has better aerothermal performance. However, the disadvantages are that it does not have as high a temperature capability, nor as good a bond with the ceramic, as the ceramic upon the MCrAlY bond coat or the ceramic upon the platinum enriched outer layer of the MCrAlY bond coat. Nevertheless the temperature capability of the thermal barrier coating is adequate for temperatures up to about 1170° C.

EXAMPLE 5

A batch of specimens were produced using a nickel superalloy called CMSX-4, a trade name of the Cannon-Muskegon Corporation, of 2875 Lincoln Street, Muskegon, Mich., MI 49443-0506 U.S.A. Its nominal composition is given in Table 3 above. Some of the superalloy article specimens were coated with different thicknesses of platinum, these were 3, 7, 12.5 and 17.5 micrometers thickness of platinum to determine the effect of the platinum thickness on the durability of the thermal barrier coating. These specimens were then heat treated at 1150° C. Some of the superalloy article specimens were coated with 7 micrometers thickness of platinum, and these specimens were heat treated at different temperatures to determine the effects of the heat treatment temperature, these were 1000°

C., 1100° C., 1150° C. and 1190° on the durability of the thermal barrier coating. Some of the specimens as mentioned above were platinum plated and heat treated but the ceramic was not applied. An X-ray diffraction analysis of the outer surface of the superalloy articles after platinum plating and heat treatment was performed.

The X-ray diffraction analysis of the outer surface layer is able to penetrate to a depth of 3–5 micrometers from the surface of the superalloy article.

The analysis of the specimen with a 7 micrometer thickness of platinum applied and which was heat treated at 1000° C., which corresponds to the prior art method taught in U.S. Pat. No. 5,427,866, revealed that platinum enriched gamma and platinum enriched gamma prime phases were produced, but also an unknown phase was detected. The micrograph examination confirmed that a structure as shown in FIG. 3 was not produced, but rather had a structure shown in FIG. 5, in which platinum enriched gamma and platinum enriched gamma prime phases are formed with the unknown phase directly on the platinum enriched gamma and platinum enriched gamma prime phases at the outer surface. The unknown phase has reduced levels of aluminum, only 3.3 wt %, compared to the platinum enriched gamma and platinum enriched gamma prime phases. It is believed that this unknown phase will not have enough aluminum to form alumina to bond the ceramic onto the superalloy substrate.

Figure 5:
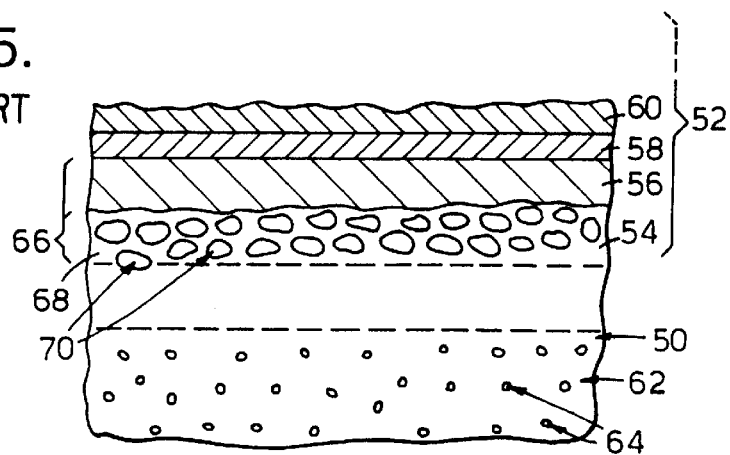
FIG. 5 is an enlarged cross-sectional view through a metallic article having a thermal barrier coating produced by a prior art method.

The microstructure of the superalloy substrate 50 generally comprises two phases, as seen more clearly in FIG. 5, these being a gamma phase matrix 62 and a gamma prime phase 64 in the gamma prime phase matrix 62. The gamma prime phase 64 forming a reinforcement in the gamma phase matrix 62. The heat treatment of the 7 micrometer thick platinum layer 66 on the superalloy substrate 50 causes aluminum in the superalloy substrate 50 to be diffused outwards towards the platinum layer 66 on the surface of the superalloy substrate 50. This results in the formation of a platinum enriched gamma phase 68 and a platinum enriched gamma prime phase 70 and an unknown phase 56 on the phases 68 and 70 on the outer surface layer of the superalloy article 50. The aluminum in the unknown phase 56 on the outer surface layer of the superalloy article 50 is available for formation of alumina 58 to bond to the ceramic layer 60.

In operation the structure shown in FIG. 5 is unstable because the operating temperatures in the gas turbine engine will cause phase changes to occur underneath the alumina and ceramic. In particular there is a significant change in volume if the unknown phase changes to a platinum enriched gamma phase or platinum enriched gamma prime phase, due to the fact that the size of the crystal structures are so different between the platinum enriched gamma phase, or platinum enriched gamma prime phase, and the unknown phase. This will make the use of the structure shown in FIG. 5 unsuitable for bonding a ceramic layer to the superalloy article, because these volume changes associated with phase changes will result in the ceramic layer becoming debonded.

The analysis of the specimen with a 7 micrometer thickness of platinum applied and which was heat treated at 1100° C. revealed that platinum enriched gamma and platinum enriched gamma prime phases were produced, and a micrograph examination confirmed that a structure as shown in FIG. 3 is produced. The compositions of the platinum enriched gamma phase and platinum enriched gamma prime phase are substantially the same as those for heat treatment at 1150° C.

The analysis of the specimen with a 7 micrometer thickness of platinum applied and which was heat treated at 1150° C. revealed that platinum enriched gamma and platinum enriched gamma prime phases were produced, and a micrograph examination confirmed that a structure as shown in FIG. 3 is produced. The composition of one of the platinum enriched gamma prime phases is about 53.7 wt % Pt, 29.5 wt % Ni, 2.5 wt % Ta, 1.0 wt % Ti, 4.8 wt % Al, 0.35 wt % Re, 1.6 wt % W, 0.2 wt % Mo, 3.6 wt % Co and 3.0 wt % Cr. The composition of one of the platinum enriched gamma phases is 48.6 wt % Pt, 29.7 wt % Ni, 0.8 wt % Ta, 0.3 wt % Ti, 2.75 wt % Al, 1.2 wt % Re, 2.6 wt % W, 0.5 wt % Mo, 6.7 wt % Co and 6.9 wt % Cr. The analysis of the specimen with a 7 micrometer thickness of platinum applied and which was heat treated at 1190° C. revealed that platinum enriched gamma and platinum enriched gamma prime phases were produced, and a micrograph examination confirmed that a structure as shown in FIG. 3 is produced. The compositions of the platinum enriched gamma phase and platinum enriched gamma prime phase are substantially the same as those for heat treatment at 1150° C.

The analysis of the specimen with a 3 micrometer thickness of platinum applied and which was heat treated at 1150° C. revealed that platinum enriched gamma and platinum enriched gamma prime phases were produced, and a micrograph examination confirmed that a structure as shown in FIG. 3 is produced. However, it was found that there was not as much platinum enrichment as for the specimen with a 7 micrometer platinum layer and thus it forms platinum enriched gamma and platinum enriched gamma prime phases with different compositions. This is not a continuous platinum enriched outer surface layer.

The analysis of the specimen with a 12.5 micrometer thickness of platinum applied and which was heat treated at 1150° C. revealed that platinum enriched gamma and platinum enriched gamma prime phases were produced, but also an additional unknown phase was detected. The micrograph examination confirmed that a structure as shown in FIG. 3 was not produced, but rather had a structure shown in FIG. 5, in which platinum enriched gamma and platinum enriched gamma prime phases are formed with an unknown phase directly on the platinum enriched gamma and platinum enriched gamma prime phases at the outer surface. The unknown phase has reduced levels of aluminum, only 3.3 wt %, compared to the platinum enriched gamma and platinum enriched gamma prime phases. It is believed that this unknown phase will not have enough aluminum to form essentially pure alumina to bond the ceramic onto the superalloy substrate.

The analysis of the specimen with a 17.5 micrometer thickness of platinum applied and which was heat treated at 1150° C. revealed the same unknown phase as for the 12.5 micrometer thickness was produced. The micrograph examination confirmed that this unknown phase was produced but also platinum enriched gamma and platinum enriched gamma prime phases were produced, and that the structure is as shown in FIG. 5, in which platinum enriched gamma and platinum enriched gamma prime phases are formed with the unknown phase directly on the platinum enriched gamma and platinum enriched gamma prime phases at the outer surface. The thickness of the unknown phase is much thicker and hence the X-rays cannot penetrate to the platinum enriched gamma and platinum enriched gamma prime phases. The unknown phase has reduced levels of aluminum, only 3.3 wt %, compared to the platinum enriched gamma and platinum enriched gamma prime phases. It is believed that this unknown phase will not have enough aluminum to form essentially pure alumina to bond the ceramic onto the superalloy substrate.

The unknown phase is believed to be some form of ordered phase of platinum, nickel and aluminum. The composition of the unknown phase has been determined to be 79 wt % Pt, 12.6 wt % Ni, 3.0 wt % Al, 0.11 wt % Ti, 2.3 wt % Co, 2.7 wt % Cr and trace levels of Re, W, Mo and Ta.

The differences between the structures for the 7 micrometer thickness of platinum at the temperatures of 1100 ° C., 1150° C. and 1190° C. is that the platinum enriched gamma prime pegs become coarser with increasing temperature.

Figure 6:
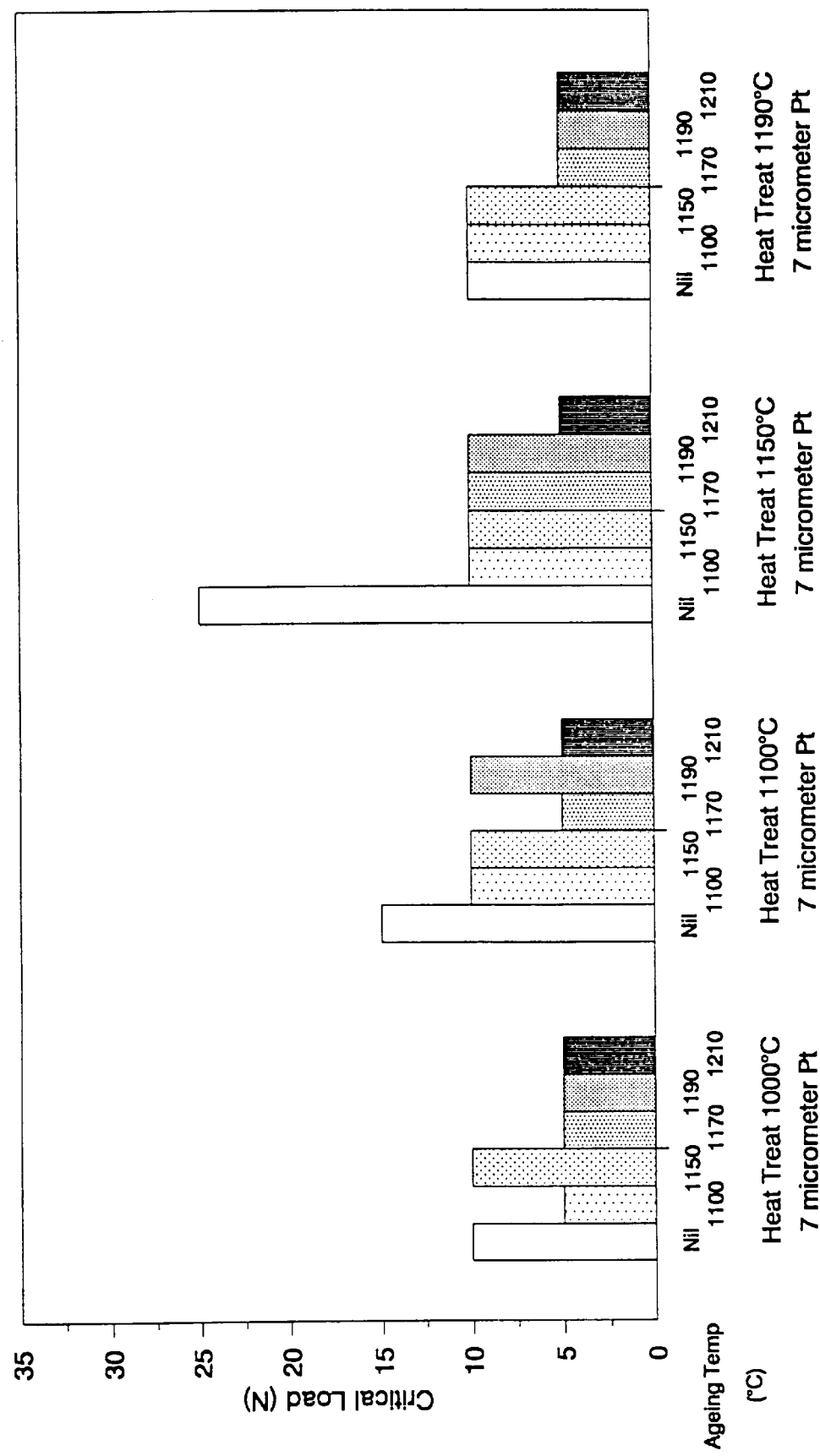
FIG. 6 is a bar chart showing the results of tests of relative performance of four different coating types produced using different heat treatment temperatures.
Figure 7:
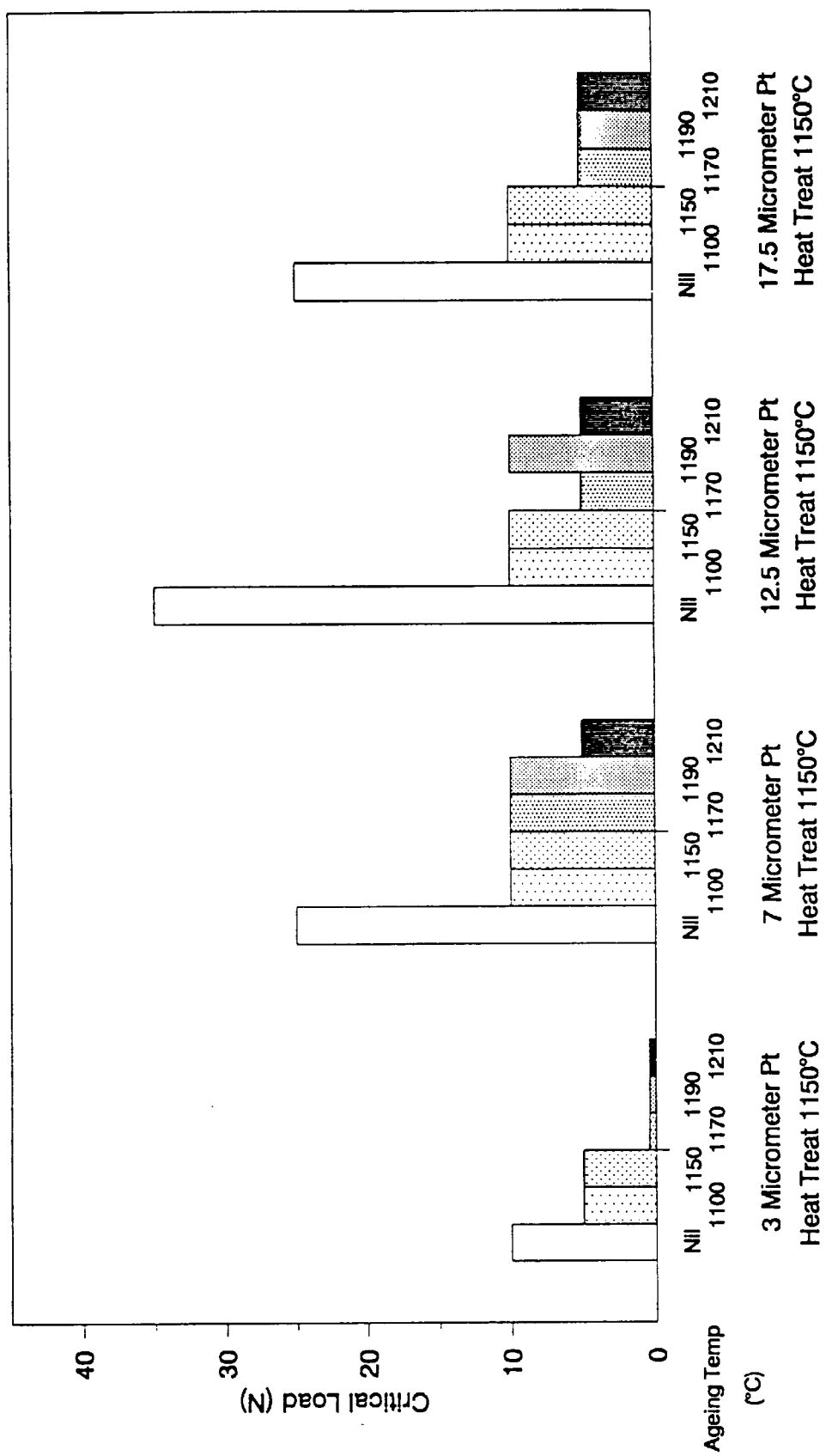
FIG. 7 is a bar chart showing the results of tests of relative performance of four different coating types produced using different thicknesses of platinum.

Some of these specimens were subjected to a standardized adhesion test in which the strength of the bond between the ceramic layer and the platinum enriched outer layer on the superalloy substrate was determined and the results are shown in FIGS. 6 and 7.

The 7 micrometer thickness of platinum, which had been heat treated at 1000° C., had a critical load of 10 Newtons in the as processed condition without any aging. The 7 micrometer thickness of platinum, which had been heat treated at 1100° C., had a critical load of 15 Newtons in the as processed condition without any aging. The 7 micrometer thickness of platinum, which had been heat treated at 1150° C., had a critical load of 25 Newtons in the as processed condition without any aging. The 7 micrometer thickness of platinum, which had been heat treated at 1190° C., had a critical load of 10 Newtons in the as processed condition without any aging.

The 3 micrometer thickness of platinum, which had been heat treated at 1150° C., had a critical load of 10 Newtons in the as processed condition without any aging. The 12.5 micrometer thickness of platinum, which had been heat treated at 1150° C., had a critical load of 35 Newtons in the as processed condition without any aging. The 17.5 micrometer thickness of platinum, which had been heat treated at 1150° C., had a critical load of 25 Newtons in the as processed condition without any aging.

The remaining specimens were then subjected to an aging process to simulate a period of service in the turbine of a gas turbine engine. The aging processes were 25 hours at 1100° C., 25 hours at 1150° C., 25 hours at 1170° C., 25 hours at 1190° C. and 25 hours at 1210° C. and then the relative adhesion strengths of the different bond coats were determined. If the coating failed in the mount of the adhesion strength tester, then it was assigned a strength of 5 Newtons.

The 7 micrometer thickness of platinum, which had been heat treated at 1000° C., had a critical load of 5 Newtons at 1100° C., 10 Newtons at 1150° C., but had a critical load of 5 Newtons at 1170° C., 1190° C. and 1210° C. The 7 micrometer thickness of platinum, which had been heat treated at 1100° C., had a critical load of 10 Newtons at temperatures of 1100° C., 1150° C. and 1190° C., and had a critical load of 5 Newtons at 1170° C. and 1210° C. The 7 micrometer thickness of platinum, which had been heat treated at 1150° C., had a critical load of 10 Newtons at temperatures up to 1190° C., and had a critical load of 5 Newtons at 1210° C. The 7 micrometer thickness of platinum, which had been heat treated at 1190° C., had a critical load of 10 Newtons at temperatures of 1100° C. and 1150° C., and had a critical load of 5 Newtons at 1170° C., 1190° C. and 1210° C. The results of the effect on adhesion strength of different heat treatment temperatures, on a 7 micrometer thick platinum layer, are shown more clearly in FIG. 6.

The 3 micrometer thickness of platinum, which had been heat treated at 1150° C., had a critical load of 5 Newtons at 1100° C. and 1150° C., but had a critical load of 0 Newtons at 1170° C., 1190° C. and 1210° C., because the coating spalled. The 12.5 micrometer thickness of platinum, which had been heat treated at 1150° C., had a critical load of 10 Newtons at 1100° C., 1150° C. and 1190° C., and had a critical load of 5 Newtons at 1170° C. and 1210° C. The 17.5 micrometer thickness of platinum, which had been heat treated at 1150° C., had a critical load of 10 Newtons at temperatures up to 1150° C., and had a critical load of 5 Newtons at 1170° C., 1190° C. and 1210° C. The results of the effect on adhesion strength of different thicknesses of the platinum layer, at a heat treatment temperature of 1150° C., are shown more clearly in FIG. 7.

Thus it can be seen from the results of the testing that the heat treatment at 1100° C. to 1200° C. for a 7 micrometer thick layer of platinum produces better results than for the heat treatment at 1000° C. for a 7 micrometer thick layer of platinum, and in fact there is up to a 40° C. temperature capability improvement before failure occurs. Thickness of platinum equal to, or less than, 3 micrometers does not produce acceptable ceramic thermal barrier coating adhesion. It can be seen that there is some inconsistency in the adhesion strength for the 7 micrometer thick platinum layer heat treated at 1100° C. for one hour and for the 12.5 micrometer thick platinum layer heat treated at 1150° C. for one hour. The 12.5 micrometer thick platinum layer may be heat treated at 1150° C. for a longer time period to ensure that all the platinum combines to form the platinum enriched gamma and platinum enriched gamma prime phases and ensure that none of the unknown phase is formed. It may be possible again to use heat treatment for longer time periods for the 17.5 micrometer thick platinum layer, but this does not have any benefits over the thinner platinum layers and is more expensive.

The elements hafnium, titanium and tantalum tend to favor the platinum enriched gamma prime phase. It is postulated that when the levels of these transition metal elements in the platinum enriched gamma prime phase reaches a critical level there is a reduction in the adhesion of the thermal barrier coating. It is theorized that this may be due to the lowering of the gamma prime solvus temperature or any benefits due to the platinum enrichment are reduced when large concentrations of these transition metal elements are present, i.e. the platinum enriched gamma prime phase releases more of the transition metal elements with increases in concentration of the transition metal elements and these released transition metal elements may effect the oxide layer.

The platinum enriched gamma and platinum enriched gamma prime phases grow by drawing elements into their respective phases, and partitioning occurs in well known ratios. For example in the platinum enriched gamma prime phase the ratio is $Ni_3X$ or $Pt_3X$, where X is Al, Ti, Ta, Hf, Cr etc, but there are no restrictions for composition of the platinum enriched gamma phase.

It is postulated that because the transition metal elements are favored in the platinum enriched gamma prime phase, then the titanium, tantalum, hafnium, etc. are fixed in these phases. In the platinum enriched gamma phase the stability of the titanium, tantalum, hafnium etc is reduced and therefore these transition metal elements are more mobile in these phases.

We have observed that the outer surface layer of the superalloy substrate article shown in FIG. 5, generally comprises the unknown phase which we have termed the "O" phase, but may in some instances be a platinum enriched gamma phase. If the outer surface layer is "O" phase then it tends to have low titanium and tantalum levels because these transition metal elements are tied up in the platinum enriched gamma prime phase. Therefore the oxide which forms on the "O" phase is relatively pure alumina. The "O" phase has a higher level of platinum which, it is postulated, compensates to some degree for the lower level of aluminum when considering alumina formation. If the outer surface layer is platinum enriched gamma phase, then the titanium levels are about the same as for the "O" phase although the tantalum levels are higher than for the "O" phase. The level of aluminum in the platinum enriched gamma phase is less than that in the "O" phase, but it is postulated that the additional chromium present relative to the "O" phase will aid formation of alumina.

The platinum enriched gamma prime phase has relatively high levels of titanium and tantalum but this is balanced by the greater stability of the platinum enriched gamma prime phase, which it is postulated chemically ties up the titanium and tantalum, etc. and prevents them having an influence on the adhesion of the ceramic thermal barrier coating.

In all of these cases it is theorized that the platinum suppresses the formation of lesser protective oxide scales by either making the formation of alumina more favorable by increasing the alumina activity or by reducing the movement of transition metal elements through the bond coating by forming strong compounds or by some chemical influence on the transition metal elements.

EXAMPLE 6

A batch of specimens as illustrated in FIG. 2 were produced using a nickel based superalloy called CMSX-4, a trade name of the Cannon-Muskegon Corporation, of 2875 Lincoln Street, Muskegon, Mich., MI 49443-0506 U.S.A. Its nominal composition is given in Table 3 above. The superalloy article specimens were coated with 5 micrometers thickness of platinum alloy containing hafnium by sputtering. The hafnium was present up to about 0.8 wt %, preferably up to 0.5 wt %. Thereafter the hafnium containing platinum layer was heat treated at 1100° C. to 1200° C., in this example 1150° C., for up to six hours, preferably for one hour to diffuse the hafnium and platinum to form platinum enriched gamma and platinum enriched gamma prime phases, both of which contain hafnium. The hafnium content of the specimen was 0.75 wt % and this was compared to a specimen with 5 micrometer thickness of platinum without hafnium and to a specimen without any platinum.

Some of these specimens were subjected to a standardized adhesion test in which the strength of the bond between the ceramic layer and the platinum enriched outer layer on the superalloy substrate was determined.

The specimen having 5 micrometer thickness of platinum containing hafnium had a critical load of 25 Newtons in the as processed, without aging, condition. The specimen having only 5 micrometer thickness of platinum had a critical load of 15 Newtons in the as processed condition. The specimen without any platinum, i.e. the ceramic layer is bonded directly to an oxide layer on the superalloy substrate, had a critical load of 15 Newtons in the as processed condition.

The remaining specimens were then subjected to an aging process to simulate a period of service in the turbine of a gas turbine engine. The aging processes were 25 hours at 1100° C., 25 hours at 1150° C. and 25 hours at 1170° C., and then the relative adhesion strengths of the different bond coats were determined.

Figure 8:
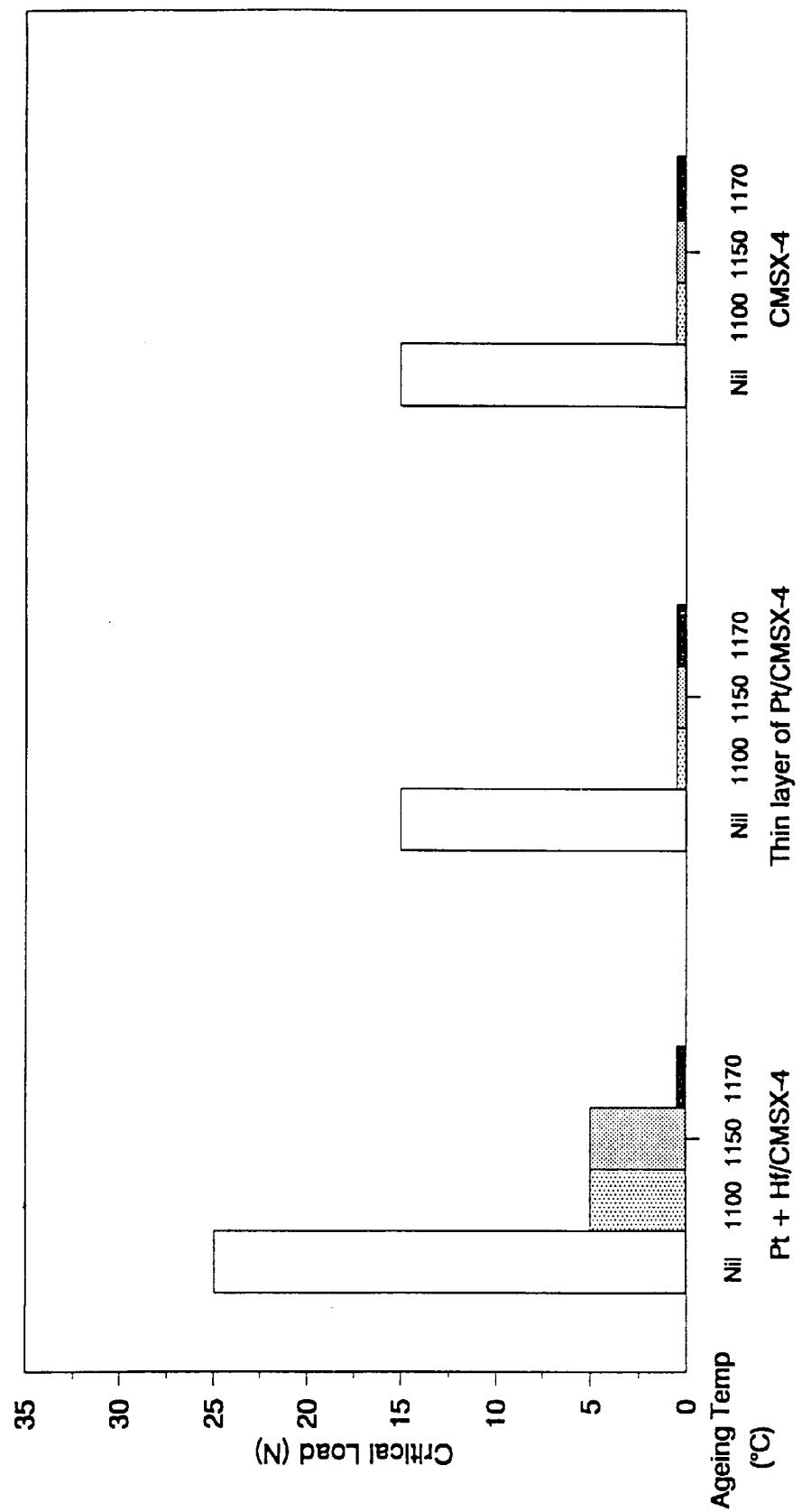
FIG. 8 is a bar chart showing the results of tests of relative performance of three different coating types produced using platinum containing hafnium, platinum and no platinum.

The specimens with 5 micrometer thickness of platinum had a critical load of 0 Newtons for aging for 25 hours at 1100° C., 1150° C. and 1170° C. The specimens with 5 micrometer thickness of platinum with the hafnium had a critical load of 5 Newtons for aging for 25 hours at 1100 ° C. and 1150° C., but had a critical load of 0 Newtons for aging for 25 hours at 1170° C. The specimens without any platinum had a critical load of 0 Newtons for aging for 25 hours at 1100° C., 1150° C., and 1170° C. These results are shown in FIG. 8.

Thus it can be seen that the addition of hafnium to the platinum is beneficial in that it increases the temperature capability of the thermal barrier coating. It is clear that this would be improved by using 7 micrometer thickness of platinum.

It is also possible to apply a layer of cobalt, or chromium, either between the superalloy substrate and the platinum-group metal or on top of the platinum-group metal. The additional layers are generally up to 8 micrometer in thickness typically 5 to 8 micrometer in thickness. The additional layers may be applied by PVD, CVD or by an electroplating process.

The use of an additional cobalt layer would be beneficial because cobalt improves the adhesion of the oxide scale on the platinum enriched gamma and platinum enriched gamma prime containing layer. The use of an additional chromium layer would be beneficial because it aids oxide bonding by increasing the aluminum activity and will also improve the oxidation behaviour of the platinum enriched gamma and platinum enriched gamma prime phases.

EXAMPLE 7

A batch of specimens as illustrated in FIG. 2 were produced using a nickel based superalloy called CMSX-4, a trade name of the Cannon-Muskegon Corporation, of 2875 Lincoln Street, Muskegon, Mich., MI49442-0506, USA. Its composition is given in Table 3 above. Some of the superalloy article specimens were coated with 10 micrometers thickness of platinum, were then heat treated at 1100° C. for one hour, were then coated with 7 micrometer thickness of cobalt and heat treated at 1150° C. for one hour. These specimens were then coated with ceramic by electron beam physical vapor deposition. Some of the superalloy article specimens were coated with either 2.5 or 7 micrometers thickness of cobalt, were then heat treated at either 1000° C. or 1100° C. for one hour, were then coated with 10 micrometer thickness of platinum and were then heat treated at 1100° C. or 1150° C. for one hour. These specimens were then coated with ceramic by electron beam physical vapor deposition.

The best results were obtained from the combination of 7 micrometer thickness of cobalt diffused at 1000° C. or 1100° C. with 10 micrometer thickness of platinum diffused at 1150° C. It is theorized that the outer layer of the bond coating contains a top layer of platinum enriched gamma phase and/or a cobalt platinum phase, while an under layer of the bond coating contains platinum enriched gamma and platinum enriched gamma prime phases, with the transition metal elements being maintained in the platinum enriched gamma prime phases. The X-ray analysis of the under layer to identify the phases is not possible due to the depth of this layer form the surface.

The composition of the phases for the top and under layers of the bond coating for the 7 micrometer thickness of cobalt diffused at 1100° C. and 10 micrometer thickness of platinum diffused at 1150° C. are as follows. The top layer has a first phase with a composition of 76.9 wt % Pt, 10.3 wt % Ni, 7 wt % Co, 3.4 wt % Al, 2.3 wt % Cr, 0.12 wt % Ti, and 0.03 wt % Re. The top layer has a second phase with a composition of 71.4 wt % Pt, 13.1 wt % Ni, 11 wt % Co, 3.3 wt % Cr, 1.06 wt % Al, and 0.09 wt % Ti. The under layer platinum enriched gamma prime phase has a composition of 72.4 wt % Pt, 12.7 wt % Ni, 5.1 wt % Ta, 3.9 wt % Co, 3 wt % Al, 1.1 wt % Cr, 0.9 wt % Ti, 0.77 wt % W and 0.07 wt % Re. The under layer platinum enriched gamma phase has a composition of 65 wt % Pt, 16.7 wt % Ni, 11.9 wt % Co, 3.6 wt % Cr, 1.44 wt % Al, 0.5 wt % Ta, 0.45 wt % W, 0.27 wt % Ti, 0.15 wt % Re and 0.07 wt % Mo.

In contrast the 2.5 micrometer thickness of cobalt heat treated at 1100° C. followed by 10 micrometer thickness of platinum heat treated at 1150° C. shows higher levels of titanium in the top layer. In cyclic testing at 1135° C., this coating failed after 140 cycles.

Figure 9:
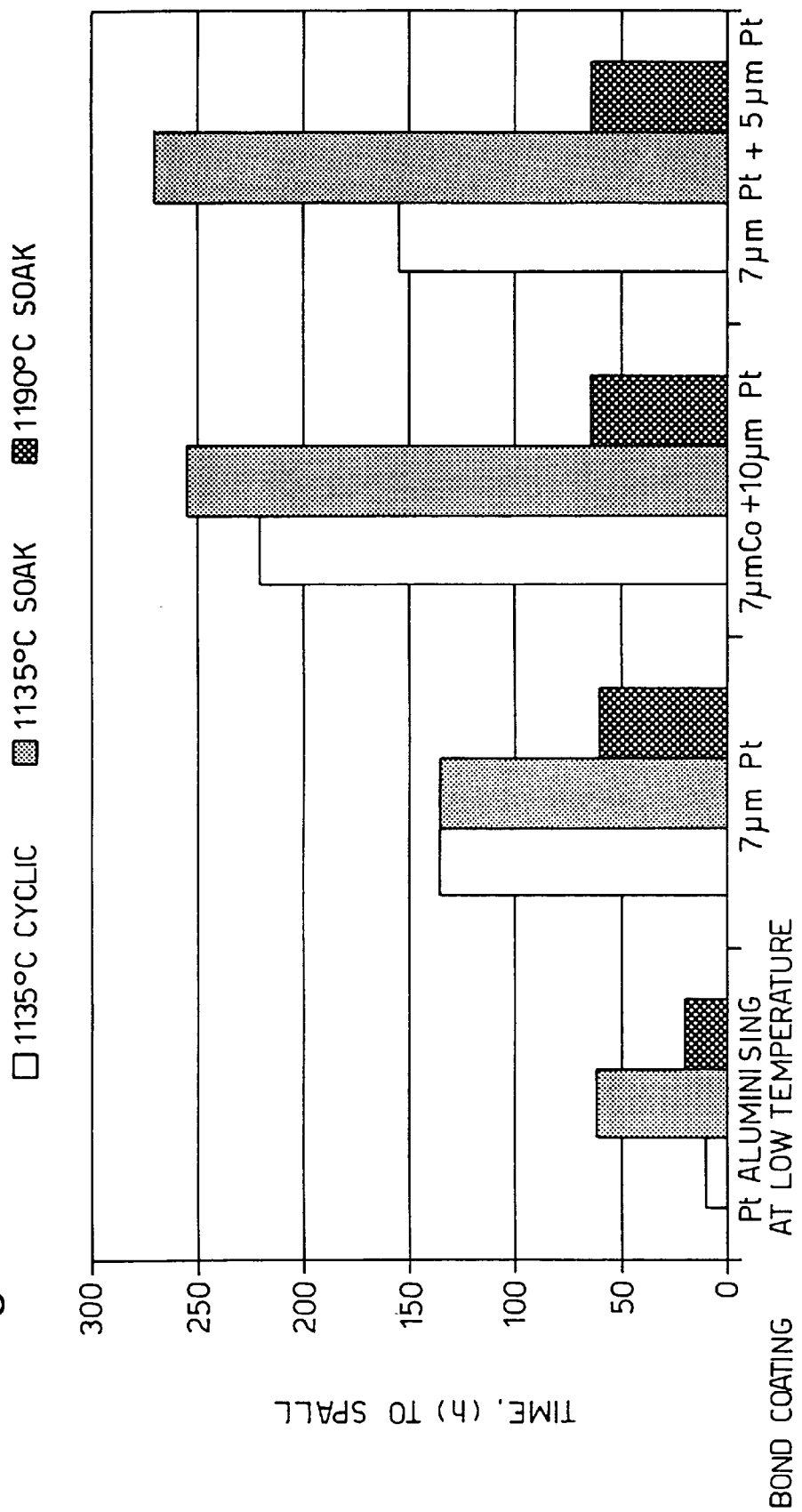
FIG. 9 is a bar chart comparing the time to spall of coatings according to the present invention and a prior art coating for cyclic testing at 1135° C., maintaining at 1135° C. and maintaining at 1190° C.

FIG. 9 shows the testing for the 7 micrometer thickness of cobalt heat treated at 1100° C. and 10 micrometer thickness of platinum heat treated at 1150° C. It is apparent from FIG. 9 that this combination of cobalt and platinum layers produced a bond coating which has a better cyclic life at 1135° C. than a single platinum layer, a double platinum layer or a prior art platinum aluminide bond coating produced by platinum plating and aluminizing at 800° C. to 950° C.

EXAMPLE 8

A batch of specimens were produced using a nickel superalloy called CMSX-4, which has a composition given in Table 3 above. All of the superalloy article specimens were coated with 7 micrometer thickness of platinum and were heat treated at 1150° C. for one hour. Some of the superalloy article specimens were then coated with 5 micrometer thickness of platinum and were heat treated at 900° C. for one hour. Some of the superalloy article specimens were coated with 5 micrometer thickness of platinum and were heat treated at 1000° C. for one hour. Finally some of the superalloy article specimens were then coated with 5 micrometer thickness of platinum and were heat treated at 1100° C. for one hour. To all of these superalloy article specimens a ceramic thermal barrier coating was deposited by electron beam physical vapor deposition.

The intention of these examples was to produce a stable platinum enriched gamma prime phase and platinum enriched gamma phase under layer with the first application of platinum and its heat treatment at 1150° C. so as to maintain any titanium or other transition metal elements in this under layer, and to produce a top layer with lower transition metal element levels with the second application of platinum and its heat treatment at the different temperatures of 900° C., 1000° C. and 1100° C. The titanium and any other transition metal elements would be maintained in the platinum enriched gamma prime and platinum enriched gamma phases which are more stable than the gamma prime phase in the CMSX-4 superalloy article.

The analysis of the superalloy article specimens with the second platinum layer heat treated a 900° C. showed a top layer containing platinum enriched gamma phases and "O" phases. The "O" phase is a phase which is iso-structural with germanium nickel platinum (Ge Ni $Pt_2$), this has an orthorhombic structure distorted cubic. The composition of germanium nickel platinum (Ge Ni $Pt_2$) in atomic percentage is 50 at % Pt, 25 at % Ni and 25 at % Ge, and this compares to a 15 micrometer thickness of platinum diffused at 1150° C. to form an "O" phase composition in atomic percentage of 49 at % Pt, 26 at % Ni, 14 at % Al, 6 at % Cr, 5 at % Co.

The analysis of the specimens with a second platinum layer heat treated at 1000° C. and 1100° C. indicates that the amount of titanium in the top layer increases with increasing heat treatment temperature. The phases formed in the top layer are platinum enriched gamma prime and "O" phases for heat treatment at 1000° C. and platinum enriched gamma and platinum enriched gamma prime phases for heat treatment at 1100° C.

Isothermal testing of the specimens in Example 8 and those produced in Example 5 showed that the double layer of platinum with the top layer heat treated at 900° C. out performed the single layer of platinum in Example 5, although cyclic testing showed that both had approximately the same number of cycles to failure, 100 to 150 cycles, as shown in FIG. 9.

Our cyclic testing of the coatings indicates that the coatings with the "O" phase in a top layer on top of an under layer comprising platinum enriched gamma and platinum enriched gamma prime phases are equally as good as the single layer comprising platinum enriched gamma and platinum enriched gamma prime phases.

It was originally believed that the "O" phase would not have sufficient aluminum to form alumina. However, the "O" phase has a relatively low weight percentage of aluminum but nevertheless this is a relatively high atomic percentage of aluminum. Considering the composition of the platinum enriched gamma, the platinum enriched gamma prime and the "O" phases produced from diffusion of a single layer of platinum in atomic percentage:

The platinum enriched gamma phase has a composition of 43–47 at % Ni, 22–33 at % Pt, 11–13 at % Cr, 7–10 at % Co, 6–9 at % Al, 0.4–0.8 at % Ti and 0.2–0.6 at % Ta. The platinum enriched gamma prime phase has a composition of 37–45 at % Ni, 25–34 at % Pt, 14–16 at % Al, 4–8 at % Cr, 4–5 at % Co, 1–2 at % Ti and 0.4–2 at % Ta. The "O" phase has a composition of 44–50 at % Pt, 25–28 at % Ni, 13–17 at % Al, 6–8 at % Cr, 4–5 at % Co, 0.3–0.5 at % Ti and 0–0.1 at % Ta.

The present invention provides a bond coating which has low levels of titanium or other transition metal elements, or if the transition metal elements are present then they are prevented from migrating to the alumina layer and ceramic thermal barrier coating by formation of stable compounds or phases.

The present invention provides a bond coating which slows the migration of transition metal elements to the ceramic thermal barrier coating and oxide layer, it does not have a continuous layer which blocks the migration of the transition metal elements. The bond coating is therefore not completely effective at preventing the migration of transition metal elements to the ceramic thermal barrier coating and the oxide layer.

Nevertheless, the oxide formed on the bond coating is very pure alumina, and has very little or no damaging transition metal oxides such as rutile ($TiO_2$) or $(Ti,Ta)O_2$.

In the case of a single thin platinum layer, or high heat treatment temperature for a single platinum layer, being diffused into the superalloy article the resulting single outer layer comprises platinum enriched gamma and platinum enriched gamma prime phases. In the case of a single thick platinum layer, or low heat treatment temperature for a single thin platinum layer being diffused into the superalloy article the resulting outer layer comprises a platinum enriched gamma, a platinum enriched gamma prime or an "O" phase top layer on an under layer which comprises platinum enriched gamma and platinum enriched gamma prime phases. In the case of two platinum layers being diffused into the superalloy article the resulting outer layer comprises a top layer comprising a combination of two or more of platinum enriched gamma, platinum enriched gamma prime or "O" phase on an under layer which comprises platinum enriched gamma and platinum enriched gamma prime phases. In the case of a combination of cobalt and platinum layers being diffused into the superalloy article the resulting outer layer comprises a top layer comprising either a combination of platinum enriched gamma and cobalt platinum phases or platinum enriched gamma prime in a platinum enriched gamma phase or a cobalt platinum phase on an under layer which comprises platinum enriched gamma and platinum enriched gamma prime phases.

The heat treatment may be carried out either in hard vacuum conditions at a pressure in the range of $10^{-4}$ to $10^{-5}$ Torr or in partial pressure of argon for example at $10^{-2}$ Torr.

We have found from measurement of the crystal structure of the platinum enriched gamma, platinum enriched gamma prime and "O" phase that the volume of eight platinum enriched gamma crystal cubes is 403 $A^{o3}$, that the volume of eight platinum enriched gamma prime crystal cubes is 414 $A^{o3}$ and that the volume of one "O" phase crystal cube is 425 $A^{o3}$. Thus it can be seen there is only about a 5% change in volume in changing from the "O" phase to the platinum enriched gamma phase. There is only about a 2.5% change in volume in changing from the platinum enriched gamma prime phase to the platinum enriched gamma phase. These small changes will not compromise the adhesion of the bond coating.

A major factor at arriving at the benefits of the present invention is that the heat treatment range enables full diffusion to occur between the platinum-group metal and the superalloy substrate to form the platinum enriched gamma and platinum enriched gamma prime phases. These phases are very similar in composition and any changes of phase between the two does not disturb the overlying ceramic thermal barrier coating because any changes of phase, in operation, do not result in large volume changes, compared to the prior art in which there is no, or only partial diffusion.

Whereas in the above described examples, only platinum was applied to the superalloy article and heat treated to diffuse into the outer layer of the superalloy article, other platinum-group metals may be substituted, such as palladium or rhodium.

There is no reason to suppose that the invention may not also be successfully applied to cobalt based superalloys.

A further advantage of the present invention is that the heat treatment above 1100° C. improves the yield of successfully coated superalloy articles compared to those heat treated at 1000° C.

If the present invention is applied to turbine blades, or turbine vanes, the precise thickness of the ceramic layer will be decided upon by experiment and/or calculation and will depend upon the temperature and corrosive agents to be experienced by the components during operation. For example the ceramic layer will have a thickness up to 300 micrometers ($300 \times 10^{-6}$m).

We claim:

1. A multi-layer thermal barrier coated article, comprising:
   a superalloy substrate;
   an outer layer on the superalloy substrate, the outer layer being enriched in platinum-group metal relative to an inner portion of the article, and the outer layer comprising a platinum-group metal enriched gamma phase and a platinum-group metal enriched gamma prime phase;
   an adherent layer of oxide on the outer layer of the article, and
   a ceramic coating on the adherent oxide layer.

2. A multi-layer thermal barrier coated article as claimed in claim 1 wherein the outer layer of the article comprises a top layer and an under layer,
   the top layer comprising at least one of platinum-group metal enriched gamma phase, platinum-group metal enriched gamma prime phase and an ordered phase of platinum-group metal, nickel and aluminum,
   the under layer comprising platinum-group metal enriched gamma phase and platinum-group metal enriched gamma prime phase, and
   the adherent layer of oxide is on the top layer.

3. A thermal barrier coated article as claimed in claim 2 wherein the ordered phase of platinum-group metal, nickel and aluminum comprises 44–50 at % Pt, 25–28 at % Ni, 13–17 at % Al, 6–8 at % Cr, 4–5 at % Co, 0.3–0.5 at % Ti and 0–0.1 at % Ta.

4. A multi-layer thermal barrier coated article as claimed in claim 1 wherein the outer layer of the article comprises a top layer and an under layer,
   the top layer comprising at least one of platinum-group metal enriched gamma phase and cobalt-platinum phase, and
   the under layer comprising platinum-group metal enriched gamma phase and platinum-group metal enriched gamma prime phase, and
   the adherent layer of oxide is on the top layer.

5. A multi-layer thermal barrier coated article as claimed in claim 4 wherein the top layer comprises platinum enriched gamma prime phase.

6. A multi-layer thermal barrier coated article as claimed in claim 1 wherein the ceramic coating comprises yttria stabilized zirconia.

7. A multi-layer thermal barrier coated article as claimed in claim 1 wherein the ceramic coating has a columnar structure.

8. A multi-layer thermal barrier coated article as claimed in claim 1 wherein the superalloy substrate comprises a nickel based superalloy.

9. A multi-layer thermal barrier coated article as claimed in claim 1 wherein the superalloy substrate comprises more than 4.5 wt % aluminum, less than 1.5 wt % hafnium and less than 1.5 wt % titanium.

10. A multi-layer thermal barrier coated article as claimed in claim 1 wherein the outer layer comprises up to 0.8 wt % hafnium, or up to 0.8 wt % yttrium.

11. A multi-layer thermal barrier coated article as claimed in claim 1 wherein the outer layer is further enriched in cobalt or chromium.

12. A multi-layer thermal barrier coated article as claimed in claim 1 wherein the platinum-group metal is platinum.

13. A multi-layer thermal barrier coated article as claimed in claim 1 wherein the platinum-group metal enriched gamma phase comprises 6–9 at % aluminum, and the platinum-group metal enriched gamma prime phase comprises 14–16 at % aluminum.

14. A multi-layer thermal barrier coated article as claimed in claim 1 wherein the platinum-group metal enriched gamma phase comprises 43–47 at % Ni, 22–33 at % Pt, 11–13 at % Cr, 7–10 at % Co, 6–9 at % Al, 0.4–0.8 at % Ti and 0.2–0.6 at % Ta, and the platinum-group metal enriched gamma prime phase comprises 37–45 at % Ni, 25–34 at % Pt, 14–16 at % Al, 4–8 at % Cr, 4–5 at % Co, 1–2 at % Ti and 0.4–2 at % Ta.

15. A multi-layer thermal barrier coated article as claimed in claim 1 wherein the platinum-group metal enriched gamma phase comprises 2.75 wt % aluminum, and the platinum-group metal enriched gamma prime phase comprises 4.8 wt % aluminum.

16. A multi-layer thermal barrier coated article as claimed in claim 1 wherein the platinum-group metal enriched gamma phase comprises 29.7 wt % Ni, 48.6 wt % Pt, 6.9 wt % Cr, 6.7 wt % Co, 2.75 wt % Al, 0.3 wt % Ti, 0.8 wt % Ta, 1.2 wt % Re, 2.6 wt % W and 0.5 wt % Mo, and the platinum-group metal enriched gamma prime phase comprises 29.5 wt % Ni, 53.7 wt % Pt, 3.0 wt % Cr, 3.6 wt % Co, 4.8 wt % Al, 1.0 wt % Ti, 2.5 wt % Ta, 0.35 wt % Re, 1.6 wt % W and 0.2 wt % Mo.

17. A multi-layer thermal barrier coated article, comprising;

a superalloy substrate;

an outer layer on the article, the outer layer being enriched in platinum-group metal relative to an inner portion of the article, and the outer layer comprising a platinum-group metal enriched gamma phase and a platinum-group metal enriched gamma prime phase;

an aluminum-containing alloy coating on the outer layer of the article;

an adherent layer of oxide on the aluminum-containing alloy coating; and a ceramic coating on the adherent oxide layer.

18. A multi-layer thermal barrier coated article as claimed in claim 17 wherein the platinum-group metal enriched gamma phase comprises 6–9 at % aluminum, and the platinum-group metal enriched gamma prime phase comprises 14–16 at % aluminum.

19. A multi-layer thermal barrier coated article as claimed in claim 17 wherein the platinum-group metal enriched gamma phase comprises 43–47 at % Ni, 22–33 at % Pt, 11–13 at % Cr, 7–10 at % Co, 6–9 at % Al, 0.4–0.8 at % Ti and 0.2–0.6 at % Ta, and the platinum-group metal enriched gamma prime phase comprises 37–45 at % Ni, 25–34 at % Pt, 14–16 at % Al, 4–8 at % Cr, 4–5 at % Co, 1–2 at % Ti and 0.4–2 at % Ta.

20. A multi-layer thermal barrier coated article as claimed in claim 17 wherein the platinum-group metal enriched gamma phase comprises 2.75 wt % aluminum, and the platinum-group metal enriched gamma prime phase comprises 4.8 wt % aluminum.

21. A multi-layer thermal barrier coated article as claimed in claim 17 wherein the platinum-group metal enriched gamma phase comprises 29.7 wt % Ni, 48.6 wt % Pt, 6.9 wt % Cr, 6.7 wt % Co, 2.75 wt % Al, 0.3 wt % Ti, 0.8 wt % Ta, 1.2 wt % Re, 2.6 wt % W and 0.5 wt % Mo, and the platinum-group metal enriched gamma prime phase comprises 29.5 wt % Ni, 53.7 wt % Pt, 3.0 wt % Cr, 3.6 wt % Co, 4.8 wt % Al, 1.0 wt % Ti, 2.5 wt % Ta, 0.35 wt % Re, 1.6 wt % W and 0.2 wt % Mo.

* * * * *